(12) United States Patent
Tong et al.

(10) Patent No.: US 10,980,149 B2
(45) Date of Patent: Apr. 13, 2021

(54) THERMAL SUPERCONDUCTIVE FINNED HEAT SINK AND ELECTRICAL EQUIPMENT CABINET

(71) Applicant: Karhe Technology Co., Ltd., Shanghai (CN)

(72) Inventors: Aixing Tong, Shanghai (CN); Yik Chiu Sze, Shanghai (CN); Qihong Luo, Shanghai (CN)

(73) Assignee: Karhe Technology Co., Ltd., Shanghai (CN)

( * ) Notice: Subject to any disclaimer, the term of this patent is extended or adjusted under 35 U.S.C. 154(b) by 0 days.

(21) Appl. No.: 16/491,162

(22) PCT Filed: Jul. 31, 2017

(86) PCT No.: PCT/CN2017/095221
§ 371 (c)(1),
(2) Date: Sep. 5, 2019

(87) PCT Pub. No.: WO2018/161498
PCT Pub. Date: Sep. 13, 2018

(65) Prior Publication Data
US 2020/0037470 A1    Jan. 30, 2020

(30) Foreign Application Priority Data

Mar. 7, 2017   (CN) .......................... 201710131194.2
Mar. 7, 2017   (CN) .......................... 201720215041.1

(51) Int. Cl.
*H05K 7/20*      (2006.01)
*G06F 1/20*      (2006.01)

(52) U.S. Cl.
CPC ........... *H05K 7/20409* (2013.01); *G06F 1/20* (2013.01); *H05K 7/20009* (2013.01);
(Continued)

(58) Field of Classification Search
CPC . F28F 3/02; F28F 3/12; F28F 2215/06; G06F 1/20–206; H05K 7/20009;
(Continued)

(56) References Cited

U.S. PATENT DOCUMENTS

| 6,385,047 B1 | 5/2002 | McCullough et al. |
| 2001/0001416 A1* | 5/2001 | Lee ..................... H01L 23/3672 165/80.3 |

(Continued)

*Primary Examiner* — Jacob R Crum (57) ABSTRACT

The present disclosure provides a thermal superconductive finned heat sink and an electrical equipment cabinet. The thermal superconductive finned heat sink includes: a base plate; a plurality of thermal superconductive fins inserted into the surface of the base plate; the thermal superconductive fin has a composite plate structure, a thermal superconductive channel line is formed in the thermal superconductive fin, the thermal superconductive channel line is a closed channel line, and is filled with heat-transfer working medium; the thermal superconductive fin has a U-shaped plate structure, including a flat plate main body and sides which bend relative to the flat plate main body; the projection area of the plurality of thermal superconductive fins, onto the plane where the base plate is located, is greater than the area of the base plate.

16 Claims, 4 Drawing Sheets

(52) U.S. Cl.
CPC ....... *H05K 7/2029* (2013.01); *H05K 7/20336* (2013.01); *F28F 2215/06* (2013.01)

(58) Field of Classification Search
CPC ............. H05K 7/2029; H05K 7/20336; H05K 7/20409; H05K 7/20863; H05K 7/209; H05K 7/20909; H05K 7/20963; H05K 7/20972
See application file for complete search history.

(56) References Cited

U.S. PATENT DOCUMENTS

| | | | |
|---|---|---|---|
| 2002/0007936 A1* | 1/2002 | Woerner | F21V 29/773 165/80.3 |
| 2006/0230616 A1* | 10/2006 | Zaghlol | H01L 21/4882 29/890.049 |
| 2007/0246190 A1* | 10/2007 | Wei | H01L 23/3672 165/80.3 |
| 2008/0029244 A1* | 2/2008 | Gilliland | H01L 23/473 165/80.4 |
| 2008/0062651 A1* | 3/2008 | Reis | C09K 5/041 361/710 |
| 2008/0266806 A1 | 10/2008 | Lakin et al. | |
| 2009/0195756 A1* | 8/2009 | Li | G03B 21/2033 353/54 |
| 2011/0267780 A1* | 11/2011 | Thrailkill | F21V 29/717 361/709 |
| 2012/0285660 A1* | 11/2012 | Poltorak | F28F 21/02 165/104.11 |
| 2013/0155616 A1* | 6/2013 | Tong | H05K 7/20909 361/696 |

\* cited by examiner

THERMAL SUPERCONDUCTIVE FINNED HEAT SINK AND ELECTRICAL EQUIPMENT CABINET

CROSS REFERENCES TO RELATED APPLICATIONS

This is a Sect. 371 National Stage application of a PCT International Application No. PCT/CN2017/083680, filed on May 10, 2017, which claims the benefits of priority to Chinese Patent Application No. CN201710131194.2, entitled "Thermal Superconductive Finned Heat Sink and Electrical Equipment Cabinet", filed with CNIPA on Mar. 7, 2017, and Chinese Patent Application No. CN 201720215041.1, entitled "Thermal Superconductive Finned Heat Sink and Electrical Equipment Cabinet", filed with CNIPA on Mar. 7, 2017, the contents of which are incorporated herein by reference in their entirety.

TECHNICAL FIELD

The present disclosure relates to a heat sink for cooling of high-power electronic devices, in particular to a thermal superconductive finned heat sink and an electrical equipment cabinet.

BACKGROUND

With the rapid development of power electronics technology, the requirements for modularization, integration, light weight, low cost and high reliability are getting higher and higher, thus, power device such as MOS field-effect transistors (MOSFET), Diodes, insulated gate bipolar transistors (IGBT) are widely used in electrical equipment including solar inverters, uninterruptible power supplies (UPS), charging piles, power converters (PCS), active power filter (APF), static var compensator (SVC) and frequency converters. The integration of these power components is getting higher, the power density is getting larger, and the heat generated by the power components is getting larger. If the heat generated by the power device cannot be dissipated in time, the temperature of the chip in the device will increase. It will reduce the efficiency and shorten the service life, even result in the failure of power devices and the burning and blasting of chips. Therefore, heat radiation of high-power devices has always been one of the core problems that plague packaging and using manufacturers of high-power devices.

In order to effectively solve the heat radiation problem of the power device, the power component is usually fixed on the base plate of the heat sink, and the heat is transmitted to the fins of the heat sink through the base plate. The fins have a large contact area with the air, through the heat convection between the air and the surface of the fin, the heat will be dissipated to the surrounding environment.

Figure 1A:
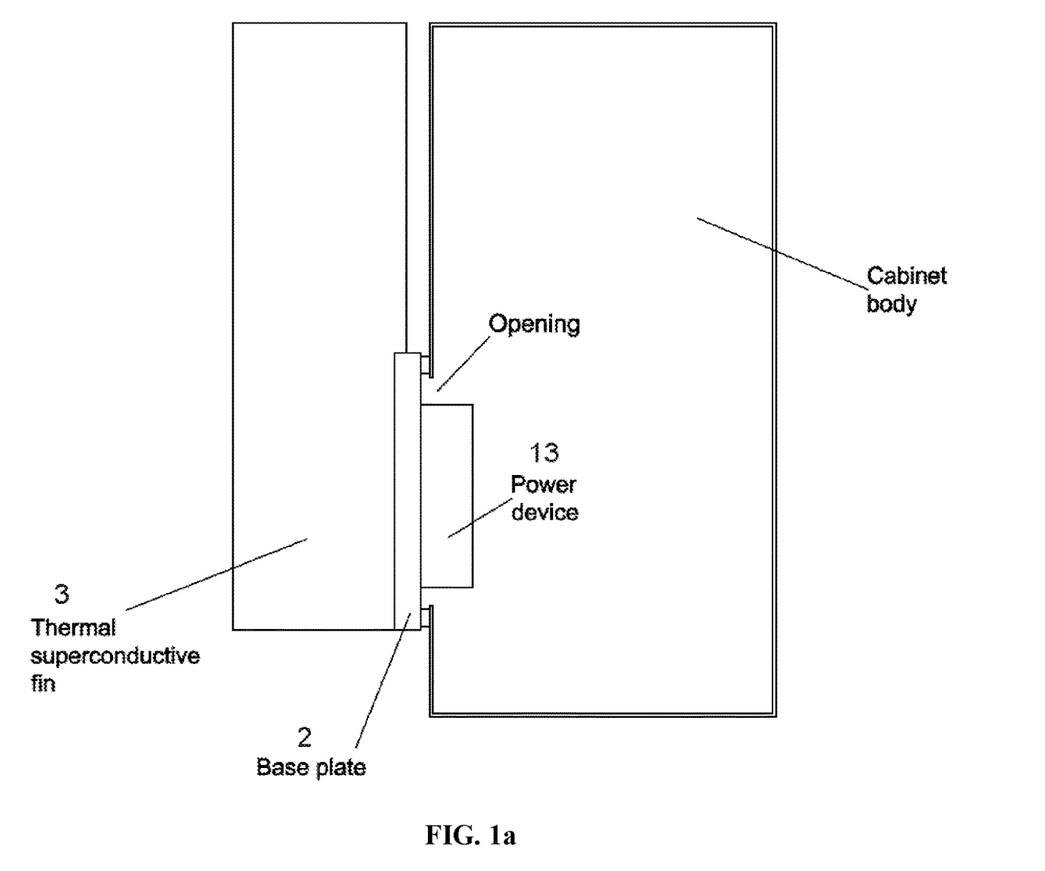
FIG. 1a shows a schematic diagram of an electrical equipment chassis according to Embodiment 3 of the present disclosure.
Figure 1B:
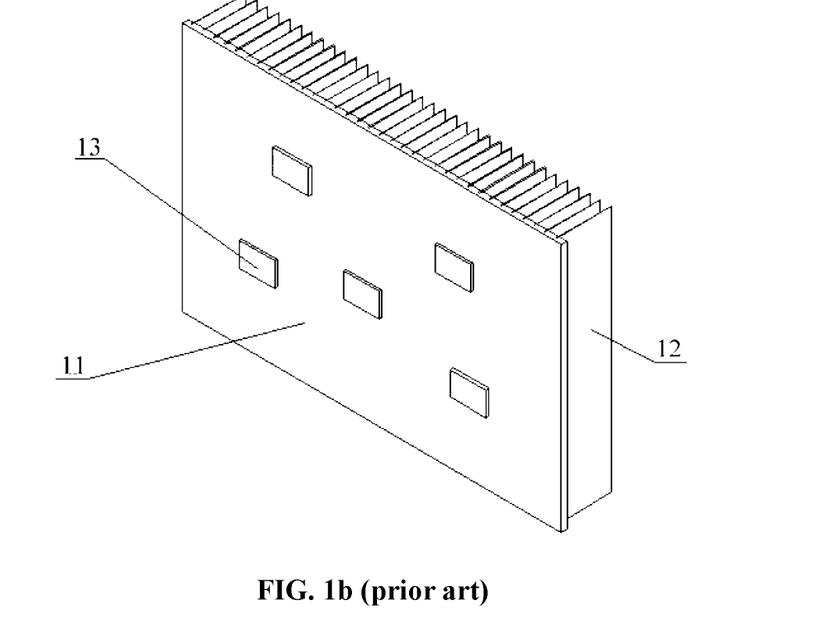
FIG. 1b shows a three-dimensional schematic diagram of an aluminum profile heat sink in the prior art.

At present, natural convection or forced convection aluminum profile heat sinks are widely used, including aluminum insert type heat sink, aluminum shovel type heat sink, aluminum extrusion type heat sink and aluminum welded fin type heat sink. The thermal conductivity of aluminum and aluminum alloy is within 220 W/m·K, the fins have low efficiency and poor thermal diffusivity, thus the fins are restricted by cost and weight. The fin thickness is 0.8 mm-2.0 mm, the fin height is within 90 mm. As shown in FIG. 1b, in the existing dislocation-type heat sink, the base plate 11 and the fins 12 have the same length. The power devices 13 are evenly distributed on the base plate 11 to reduce the thermal resistance of the base plate diffusion and improve the heat radiation capacity of the heat sink. Therefore, the heat sink is bulky and heavy. With the improvement of the performance of high-power devices, the increase of the heat flux of individual device, and the increasing of the requirements for small size and light weight, the conventional aluminum heat sink can no longer meet the heat radiation requirements of high-power modules with high heat flux.

Therefore, it is urgent to develop a kind of universal and efficient heat sink which can not only meet the requirements of high heat flux and high-power module cooling, but also be efficient and reliable, small in size, cost-effective and can replace liquid-cooling heat sink

SUMMARY

The present disclosure provides a thermal superconductive finned heat sink and electrical equipment cabinet, to solve the problems, such as large volume, heavy weight and poor heat radiation ability, which cannot meet the heat radiation requirements of high-power modules with high heat flux.

The present disclosure provides a thermal superconductive finned heat sink including: a base plate; a plurality of thermal superconductive fins, inserted into the surface of the base plate; the thermal superconductive fin has a composite plate structure, a thermal superconductive channel line which has a specific shape is formed in the thermal superconductive fin, the thermal superconductive channel line is a closed channel line, the thermal superconductive channel line is filled with heat-transfer working medium; the thermal superconductive fin has a U-shaped plate structure, the U-shaped plate structure includes a flat plate main body and sides which bend relative to the flat plate main body; the projection area of the plurality of thermal superconductive fins, onto the plane where the base plate is located, is greater than the area of the base plate.

As a preferred embodiment of the thermal superconductive finned heat sink of the present disclosure, the length direction of the thermal superconductive fins is the same as the width direction of the base plate, and the length of the thermal superconductive fins is greater than the width of the base plate.

As a preferred embodiment of the thermal superconductive finned heat sink of the present disclosure, the length direction of the thermal superconductive fins is the same as the length direction of the base plate, and the length of the thermal superconductive fins is greater than the length of the base plate.

As a preferred embodiment of the thermal superconductive finned heat sink of the present disclosure, the thermal superconductive fins are expanded in a single side, or in double sides, or are flat in double sides.

As a preferred embodiment of the thermal superconductive finned heat sink of the present disclosure, the shape of the thermal superconductive channel line is hexagonal honeycomb, circular honeycomb, quadrangular honeycomb, rectangular grid, a series of end-to-end U shapes, diamonds, triangles, circles, or a combination thereof.

As a preferred embodiment of the thermal superconductive finned heat sink of the present disclosure, the surface of the base plate contains a plurality of grooves spaced by an interval from each other. One side of the thermal superconductive fins is inserted vertically into the grooves and fixedly connected with the base plate by means of mechanical extrusion, heat-conducting adhesive bonding, brazing welding or friction stir welding, or a combination thereof.

As a preferred embodiment of the thermal superconductive finned heat sink of the present disclosure, the grooves are L-shaped, and the maximum width of the L-shaped grooves is less than or equal to the length of the side.

As a preferred embodiment of the thermal superconductive finned heat sink of the present disclosure, the thermal superconductive finned heat sink further includes reinforcing ribs, the reinforcing ribs are located at least on one side of the thermal superconductive fins, and extend along the arrangement direction of the thermal superconductive fins, and are fixedly connected with the side edge of each of the thermal superconductive fins.

As a preferred embodiment of the thermal superconductive finned heat sink of the present disclosure, the number of the reinforcing ribs is at least two, and the reinforcing ribs are located on each side of the thermal superconductive fins.

The present disclosure further provides an electrical equipment cabinet, the electrical equipment cabinet includes: a cabinet body, the side or back of the cabinet body including openings connecting inside with outside; the thermal superconductive finned heat sink as described in any of the above schemes is fixed on one side of the cabinet body including the openings, and the base plate covers the openings; a power device, located in the cabinet body and fixed on a surface of the base plate away from the thermal superconductive fins.

As described above, the thermal superconductive finned heat sink and the electrical equipment cabinet of the present disclosure have the following beneficial effects:

1. The thermal superconductive fins of the present disclosure are used to replace the conventional all metal fins in the prior art, so that the thermal superconductive finned heat sink of the present disclosure has high heat conductivity, high fin efficiency (up to 95% or more) and the fin efficiency hardly varies with the height, length and thickness of the thermal superconductive fins. With flexible and diverse structure, strong heat radiation capacity, it can meet the cooling requirements of high heat flux and large thermal power devices, and can break through the limitation of the heat radiation capacity of the air-cooled heat sink;

2. The projection area of the several thermal superconductive fins of the thermal superconductive finned heat sink, onto the plane where the base plate is located, is greater than the area of the base plate. In the premise of ensuring the heat radiation capabilities, the weight of the heat sink can be reduced.

3. The thermal superconductive fins are not limited by the low temperature and can work normally at minus 40°. They can solve the problem of water cooling heat sink which needs to heat circulating liquid at low temperature in the cold area in winter, as well as the failure problem of heat pipe heat sink at low temperature in winter, thus have better working performance.

4. The thermal superconductive fins are set as a U-shaped plate structure, which can increase the heat transfer area of the heat sink without increasing the external size of the heat sink, thus increasing the heat radiation capacity. At the same time, the mechanical strength of the thermal superconductive fins can be enhanced;

5. By providing reinforcing ribs on the thermal superconductive fins, the distance between the thermal superconductive fins can be fixed, so that the ability of the heat sink to resist deformation and the external force is enhanced;

6. The thermal superconductive finned heat sink of the present disclosure is convenient and flexible in manufacturing, low in cost, large in heat radiation capacity, light in weight and small in volume. It can replace heat pipe heat sinks and part of water cooling heat sinks, especially suitable for the heat radiation requirements of high-power and high heat flux electronic devices, thus has a broad market prospect and great economic value.

DESCRIPTION OF COMPONENT REFERENCE SIGNS

11 Base plate
12 Fin
13 Power device
2 Base plate
21 Groove
3 Thermal superconductive fin
31 Thermal superconductive channel line
32 Protrusion
33 Non-channel line part
34 Heat-transfer working medium
35 First plate
36 Second plate
37 Filling port
38 Flat plate main body
39 Side
4 Reinforcing rib
5 Power device

DETAILED DESCRIPTION OF THE PREFERRED EMBODIMENTS

The implementation mode of the present disclosure will be described below through specific embodiments. Those skilled in the art can easily understand other advantages and effects of the present disclosure according to contents disclosed by the specification. The present disclosure can also be implemented or applied through other different specific implementation modes. Various modifications or changes can also be made to all details in the specification based on different points of view and applications without departing from the spirit of the present disclosure.

Referring to FIGS. 2-7. It needs to be stated that the drawings provided in the following embodiments are just used for schematically describing the basic concept of the present disclosure, thus only illustrating components only related to the present disclosure and are not drawn according to the numbers, shapes and sizes of components during actual implementation, the configuration, number and scale of each component during actual implementation thereof may be freely changed, and the component layout configuration thereof may be more complex.

Embodiment 1

Referring to FIGS. 2-6, the present disclosure provides a thermal superconductive finned heat sink, the thermal superconductive finned heat sink includes: a base plate 2, and a plurality of thermal superconductive fins 3. The thermal superconductive fins 3 insert into the surface of the base plate 2. The thermal superconductive fins 3 have a composite plate structure. A thermal superconductive channel line 31 which has a specific shape is formed in the thermal superconductive fins 3. The thermal superconductive channel line 31 is a closed channel line and is filled with a heat-transfer medium 34. The thermal superconductive fins have a U-shaped plate structure. The U-shaped plate structure includes a flat plate main body 38 and sides 39 which bend relative to the flat plate main body 38. The projection area of the plurality of the thermal superconductive fins, onto the plane where the base plate 2 is located, is greater than the area of the base plate 2.

The thermal superconductive fins 3 of the present disclosure are used to replace the conventional all-metal fins in the prior art, so that the thermal superconductive finned heat sink of the present disclosure has high heat conductivity, high fin efficiency (up to 95% or more), and the fin efficiency hardly varies with the height, length and thickness of the thermal superconductive fins 3. With flexible and diverse structure, strong heat radiation capacity, it can solve the heat radiation requirements of high heat flux and large thermal power devices and can break through the limitation of the heat radiation capacity of the air-cooled heat sink. The projection area of the several thermal superconductive fins 3 of the thermal superconductive finned heat sink, onto the plane where the base plate 2 is located, is greater than the area of the base plate 2, and the present disclosure can reduce the weight of the heat sink in the premise of ensuring the heat radiation capabilities. The thermal superconductive fins are not limited by the low temperature and can work normally at minus 40° C. They can solve the problems that water cooling heat sink needs to heat circulating liquid at low temperature in the cold area in winter, and that heat pipe heat sink fails at low temperature in winter, thus have better working performance.

The thermal superconductive finned heat sink of the present disclosure is convenient and flexible in manufacturing, low in cost, large in heat radiation capacity, light in weight and small in volume. It can replace heat pipe heat sink and part of water cooling heat sink and is especially suitable for the heat radiation requirements of high-power and high heat flux electronic devices heat radiation requirements, thus has a broad market prospect and great economic value. The thermal superconductive fins 3 have a U-shaped plate structure, which can increase the heat transfer area of the heat sink without increasing the external size of the heat sink, thus increasing the heat radiation capacity. At the same time, the mechanical strength of the thermal superconductive fins 3 can be enhanced.

In an example, the ratio of the area of the base plate 2 to the projection area of the plurality of thermal superconductive fins 3 in the plane where the base plate 2 is located can be set according to the actual needs. In an example, the ratio is 30%, and in this case, the weight of the thermal superconductive finned heat sink is 50% of the weight of a conventional aluminum profile heat sink with the same heat radiation capability. Of course, in other examples, the ratio may be 30%, 50% or 70%, etc.

As an example, the side 39 is perpendicular to the surface of the flat plat main body 38. In other examples, the side 39 and the flat plat main body 38 may be at any desired angle, that is, the side 39 and the flat body 38 can be at an acute angle, a right angle, or an obtuse angle.

Figure 2:
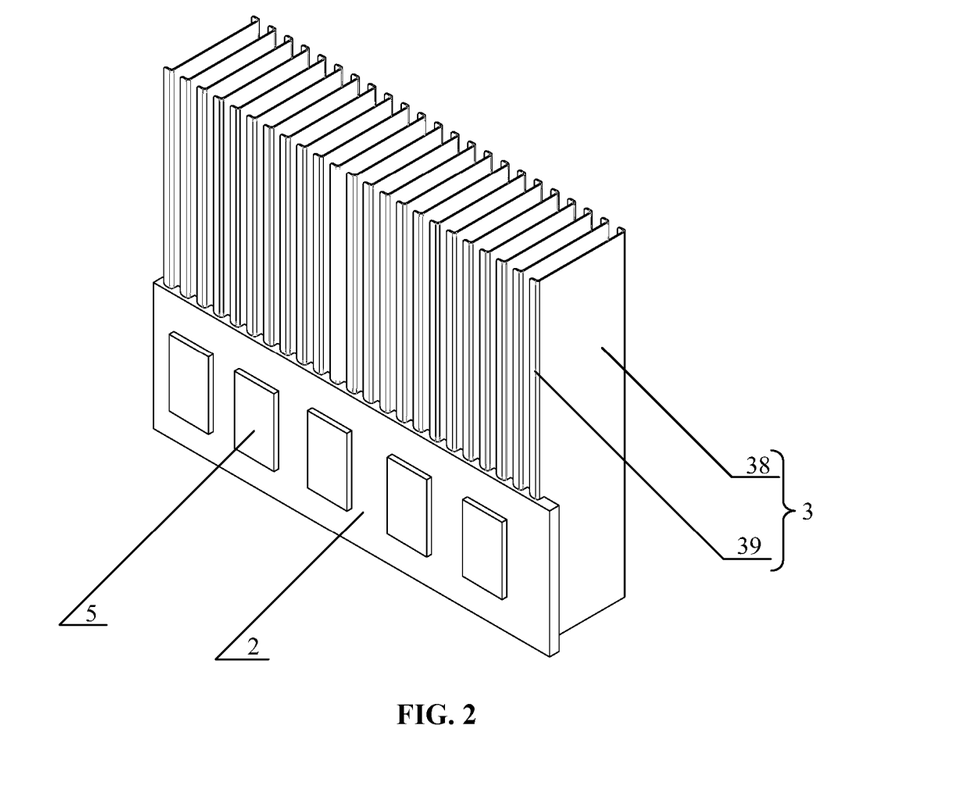
FIG. 2 shows a three-dimensional schematic diagram of a thermal superconductive finned heat sink according to Embodiment 1 of the present disclosure.

As an example, the length direction of the thermal superconductive fins 3 is the same as the width direction of the base plate 2, and the length of the thermal superconducting fins 3 is larger than the width of the base plate 2. The position of the base plate 2 relative to the thermal superconductive fins 3 may be set according to actual needs. The base plate 2 may be located adjacent to the bottom of the thermal superconductive fins 3, as shown in FIG. 2, or located in the middle of the thermal superconductive fins 3.

As an example, the surface of the base plate 2 contains a plurality of grooves 21 spaced by an interval from each other. One side of the thermal superconductive fins 3 is inserted vertically into the grooves and fixedly connected with the base plate by means of any of mechanical extrusion process (e.g., milling slot mechanical extrusion), heat-conducting adhesive bonding process, brazing welding and friction stir welding, or a combination thereof.

As an example, the shape of the grooves 21 matches the shape of the thermal superconductive fins 3 described in this embodiment, that is, the grooves are L-shaped, and the maximum width of the L-shaped grooves is less than or equal to the length of the side 39. The grooves 21 is L-shaped, such that the grooves 21 match the shape of the thermal superconductive fins 3. When the thermal superconductive fins 3 are inserted into the inside of the grooves 21, the contact area between the thermal superconductive fins 3 and the base plate 2 is maximized. The connection between the thermal superconductive fins 3 and base plate 2 are stronger while the heat radiation efficiency is improved.

Figure 3:
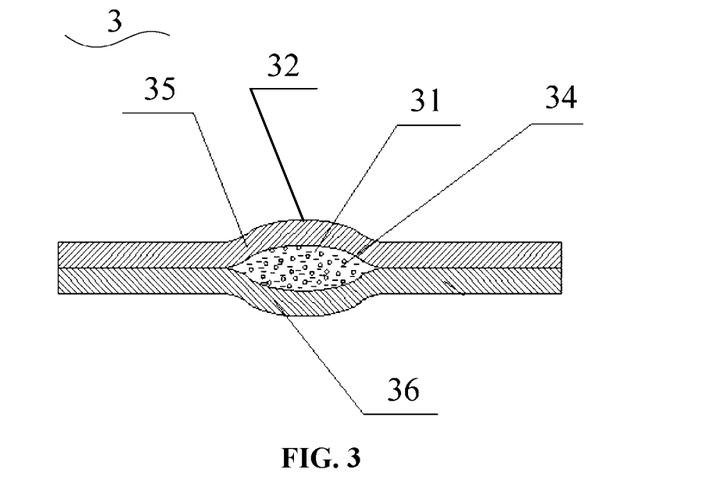
FIG. 3 is a partial cross-sectional enlarged view showing a portion of a thermal superconductive channel line of a thermal superconductive fin of a thermal superconductive finned heat sink provided in Embodiment 1 of the present disclosure.

As an example, as shown in FIG. 3, the surface of the thermal superconductive fins 3 may be expanded in double sides. The thermal superconductive fins 3 include a first plate 35 and a second plate 36. The first plate 35 and the second plate 36 are compounded by a rolling process. The thermal superconductive channel line 31 is formed by an inflation process. While forming the thermal superconductive channel line 31, protrusions 32 corresponding to the thermal superconductive channel line 31 are formed on the surfaces of the first plate 35 and the second plate 36. In addition to the structure shown in FIG. 3, when the thermal superconductive fins 3 include the first plate 35 and the second plate 36, the protrusions 32 may be formed on the surface of the first plate 35 or the second plate 36 while the thermal superconductive channel line 31 is formed by inflation process. That is, the thermal superconductive fin 3 is expanded in one side. Alternatively, the surface of the thermal superconductive fins 3 is flat in double-sides. In this case, the specific structure of the thermal superconductive fins 3 may be the same as that of thermal superconductive finned heat sink with flat double sides described in the patent application No. 201511029540.3. For details, please refer to the patent application, which will not be repeated here.

As an example, the heat-transfer working medium 34 is a fluid. Preferably, the heat-transfer working medium 34 is a gas or liquid or a mixture of gas and liquid. More preferably, in the embodiment, the heat-transfer working medium 34 is a mixture of liquid and gas.

Figure 4:
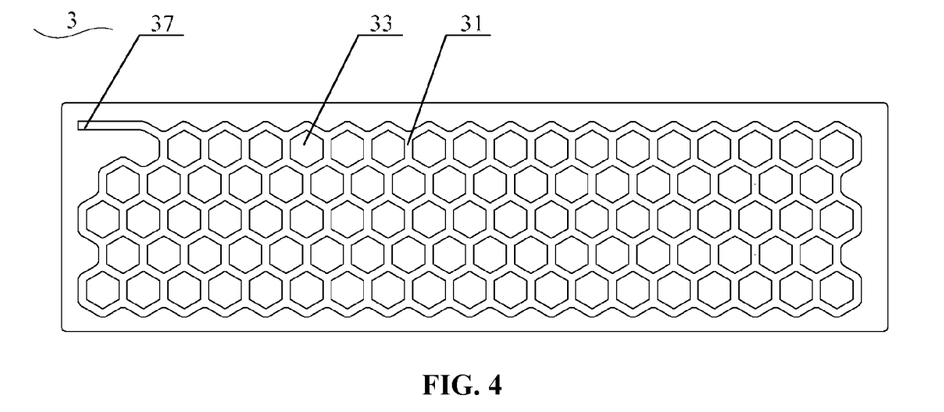
FIG. 4 is a schematic diagram of a thermal superconductive fin of a thermal superconductive finned heat sink provided in Embodiment 1 of the present disclosure, where the shape of the thermal superconductive channel line is hexagonal honeycomb.
Figure 5:
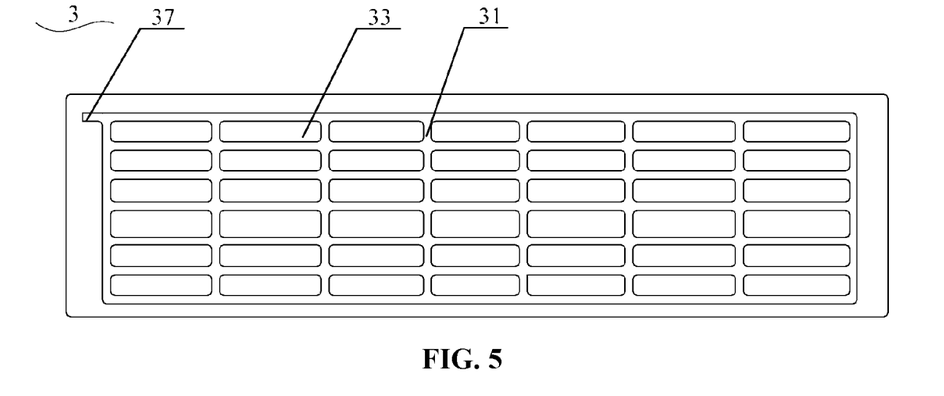
FIG. 5 is a schematic diagram of a thermal superconductive fin of a thermal superconductive finned heat sink provided in Embodiment 1 of the present disclosure, where the shape of the thermal superconductive channel line is a rectangular grid.

As an example, the shape of the thermal superconductive channel line 31 may be hexagonal honeycomb, circular honeycomb, quadrangular honeycomb, rectangular grid, or a series of end-to-end U shapes, diamonds, triangles, circles, or a combination thereof. FIG. 4 shows an example of the shape of the thermal superconductive channel line 31 being hexagonal honeycomb. FIG. 5 shows an example of the shape of the thermal superconductive channel line 31 being a rectangular grid.

Figure 6:
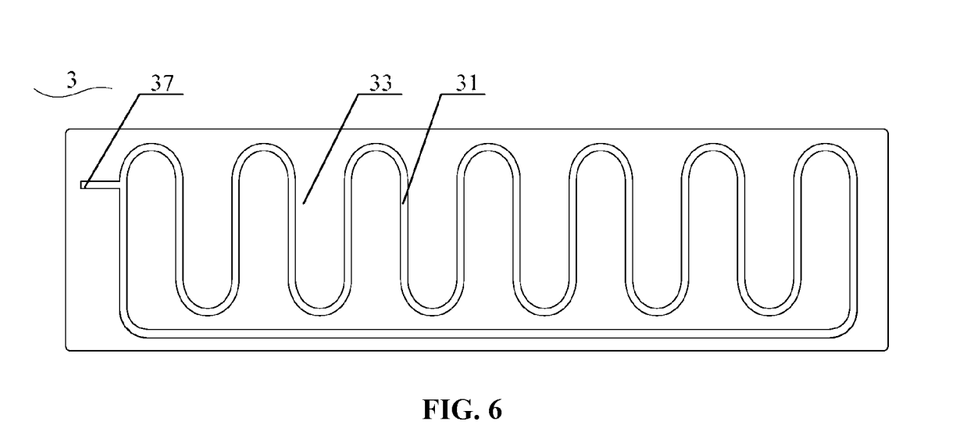
FIG. 6 is a schematic diagram of a thermal superconductive fin of a thermal superconductive finned heat sink provided in Embodiment 1 of the present disclosure, where the shape of the thermal superconductive channel line is a series of end-to-end U shapes.

FIG. 6 shows an example of the shape of the thermal superconductive channel line 31 being a series of end-to-end U shapes. As shown in FIG. 4, the interior of the hexagons and the edge area of the thermal superconductive fins 3 are the non-channel line part 33, the hexagons connected with each other are the thermal superconductive channel line 31. As shown in FIG. 5, the interior of the rectangles and the edge area of the thermal superconductive fins 3 are the non-channel line part 33, the rectangles connected with each other are the thermal superconductive channel line 31. As shown in FIG. 6, a series of end-to-end U shapes is the thermal superconductive channel line 31, the areas between and outside the thermal superconductive channel line 31 are the non-channel line part 33. It should be noted that, since the thermal superconductive channel line 31 is formed by an inflation process, in the process of forming the thermal superconductive channel line 31, the first plate 35 or the second plate 36 has a filling port 37, the filling port 37 is sealed by welding after forming the thermal superconductive channel line 31 and filling the heat-transfer working medium 34 into the thermal superconductive channel line 31, so that the thermal superconductive channel line 31 is not connected to the outside. For ease of understanding, the filling port 37 will be shown in FIGS. 4-6.

As an example, the materials of the thermal superconductive fins 3 and the base plate 2 are required to have good thermal conductivity. Preferably, in the embodiment, the materials of the thermal superconductive fins 3 and the base plate 2 may be copper, copper alloy, aluminum or aluminum alloy or a combination thereof. The material of the thermal superconductive fins 3 may be the same as or different from the material of the base plate 2. Preferably, in the embodiment, the material of the thermal superconductive fins 3 is the same as the material of the base plate 2.

The working principle of the thermal superconductive finned heat sink of the present disclosure is: utilizing the rapid thermal conductivity of the thermal superconductive fins 3, the heat generated during the working of the power device 5 fixed on another plane of the base plate 2 is conducted to the joint of the base plate 2 and the thermal superconductive fins 3 through the base plate 2, then is rapidly conducted to the entire surface of the thermal superconductive fins 3 through the heat-transfer working medium 34 within the thermal superconductive channel line 31 of the thermal superconductive fins 3. The cold air around the thermal superconductive fins 3 flows through the surface of the thermal superconductive fins 3 and takes away the heat by natural convection or forced convection to achieve cooling.

Embodiment 2

Figure 7:
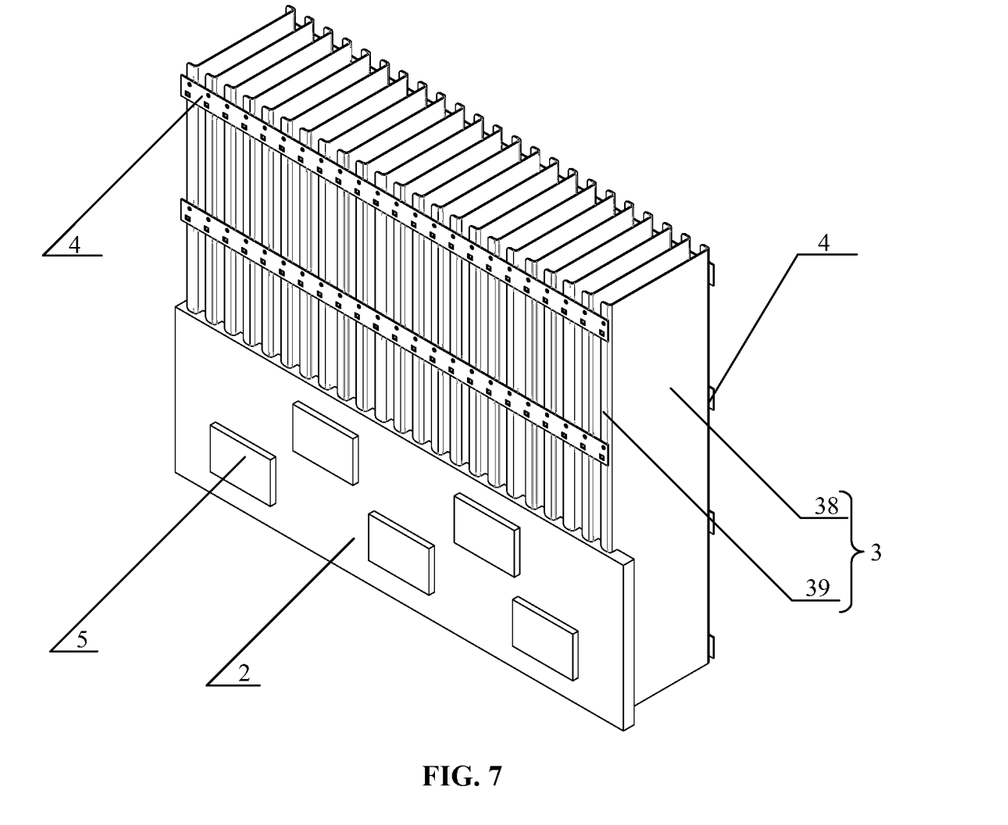
FIG. 7 shows a three-dimensional schematic diagram of a thermal superconductive finned heat sink according to Embodiment 2 of the present disclosure.

Referring to FIG. 7, the present disclosure further provides a thermal superconductive finned heat sink. The structure of the thermal superconductive finned heat sink in the present embodiment is substantially the same as that of embodiment 1, the difference is that the heat sink in embodiment 2 includes reinforcing ribs 4, the reinforcing ribs 4 are located at least on one side of the thermal superconductive fins 3, extend along the arrangement direction of the thermal superconductive fins 3, and are fixedly connected with the side edge of each of the thermal superconductive fins 3. In FIG. 7, as an example, the number of the reinforcing ribs 4 is 5. Three of the reinforcing ribs 4 are located on the side of the thermal superconductive fins 3 away from the base plate 2, and the other two of the reinforcing ribs 4 is located on the side where the thermal superconductive fins 3 contains the base plate 2. In other examples, the number of the reinforcing ribs 4 may be one, two or more according to actual needs, which is not limited herein. Of course, in other examples, the reinforcing ribs 4 may be disposed on the same side of the thermal superconductive fins 3. When the reinforcing ribs 4 are located on each side of the thermal superconductive fins 3, the reinforcing ribs 4 on opposite sides may be arranged correspondingly or distributed staggered. By providing the reinforcing ribs 4 on the thermal superconductive fins 3, the spacing of adjacent thermal superconductive fins 3 can be fixed so that the ability of the heat sink to resist deformation and external force is enhanced.

Embodiment 3

The present disclosure also provides an electrical equipment cabinet, the electrical equipment cabinet includes: a cabinet body, the side or back of the cabinet body includes openings connecting inside with outside; the thermal superconductive finned heat sink according to the embodiment 1 or the embodiment 2, fixed on one side of the cabinet body including the openings, the heat sink base plate covers the openings; a power device, located in the cabinet body and fixed on a surface of the base plate away from the thermal superconductive fins.

In summary, the present disclosure provides a thermal superconductive finned heat sink and an electrical equipment cabinet, the thermal superconductive finned heat sink including: a base plate; a plurality of thermal superconductive fins, inserted into the surface of the base plate; the thermal superconductive fin has a composite plate structure, a thermal superconductive channel line which has a specific shape is formed in the thermal superconductive fin, the thermal superconductive channel line is a closed channel line, the thermal superconductive channel line is filled with heat-transfer working medium; The thermal superconductive fin has a U-shaped plate structure, the U-shaped plate structure includes a flat plate main body and sides which bend relative to the flat plate main body; The projection area of the plurality of thermal superconductive fins, onto the plane where the base plate is located, is greater than the area of the base plate.

The thermal superconductive fins of the present disclosure are used to replace the conventional all metal fins in the prior art, so that the heat sink of the present disclosure has high heat conductivity, high fin efficiency (up to 95% or more) and the fin efficiency hardly varies with the height, length and thickness of the thermal superconductive fins. With flexible and diverse structure, strong heat radiation capacity, it can solve the heat radiation requirements of high heat flux and large thermal power devices and can break through the limitation of the heat radiation capacity of the air-cooled heat sink. The projection area is greater than the area of the base plate. In the premise of ensuring the heat radiation capabilities, the weight of the heat sink can be reduced. The thermal superconductive fins are not limited by the low temperature and can work normally at minus 40° C. This can solve the problem of water cooling heat sink which needs to heat circulating liquid at low temperature in the cold area in winter, as well as the failure problem of heat pipe heat sink at low temperature in winter, thus have better working performance.

The thermal superconductive fins have U-shaped plate structure, which can increase the heat transfer area of the heat sink without increasing the external size of the heat sink, thus increasing the heat radiation capacity and enhancing the mechanical strength of the thermal superconductive fins. By providing reinforcing ribs on the thermal superconductive fins, the distance between the thermal superconductive fins can be fixed, so that the ability of the heat sink to resist deformation and external force is enhanced. The thermal superconductive finned heat sink of the present disclosure is convenient and flexible in manufacturing, low in cost, large in heat radiation capacity, light in weight and small in volume. It can replace most heat pipe heat sinks and part of the water-cooling heat sinks, is especially suitable for the heat radiation requirements of high-power and high heat flux electronic devices cooling requirements, thus has a broad market prospect and great economic value.

The above-mentioned embodiments are just used for exemplarily describing the principle and effects of the present disclosure instead of limiting the present disclosure. Those skilled in the art can make modifications or changes to the above-mentioned embodiments without going against the spirit and the range of the present disclosure. Therefore, all equivalent modifications or changes made by those who have common knowledge in the art without departing from the spirit and technical concept disclosed by the present disclosure shall be still covered by the claims of the present disclosure.

The invention claimed is:

1. A thermal superconductive finned heat sink, comprising:
   a base plate; and
   a plurality of thermal superconductive fins, inserted into a surface of the base plate,
   wherein each of the plurality of thermal superconductive fins has a composite plate structure and a thermal superconductive channel line which has a specific shape formed in the thermal superconductive fin, the thermal superconductive channel line is a closed channel line and is filled with heat-transfer working medium,
   each of the plurality of thermal superconductive fins has a U-shaped plate structure, the U-shaped plate structure includes a flat plate main body and sides which bend relative to the flat plate main body, and
   the projection area of the plurality of thermal superconductive fins, onto the plane where the base plate is located, is greater than the area of the base plate.

2. The thermal superconductive finned heat sink according to claim 1, wherein the length direction of the each of the plurality of thermal superconductive fins is the same as the width direction of the base plate, and the length of the each of the plurality of thermal superconductive fins is greater than the width of the base plate.

3. The thermal superconductive finned heat sink according to claim 1, wherein the length direction of the each of the plurality of thermal superconductive fins is the same as the longitudinal direction of the base plate, and the length of the each of the plurality of thermal superconductive fins is greater than the length of the base plate.

4. The thermal superconductive finned heat sink according to claim 1, wherein the plurality of thermal superconductive fins are expanded in a single side, or in double sides, or are flat in double sides.

5. The thermal superconductive finned heat sink according to claim 1, wherein the shape of the thermal superconductive channel line is hexagonal honeycomb, circular honeycomb, quadrangular honeycomb, rectangular grid, a series of end-to-end U shapes, diamonds, triangles, circles, or a combination thereof.

6. The thermal superconductive finned heat sink according to claim 1, wherein the surface of the base plate contain a plurality of grooves spaced by an interval from each other, one side of the plurality of thermal superconductive fins is inserted vertically into the grooves and fixedly connected with the base plate by means of mechanical extrusion, heat-conducting adhesive bonding, brazing welding or friction stir welding, or a combination thereof.

7. The thermal superconductive finned heat sink according to claim 6, wherein the grooves are L-shaped, and the maximum width of the L-shaped grooves is less than or equal to the length of the side.

8. The thermal superconductive finned heat sink according to claim 1, further comprising reinforcing ribs, the reinforcing ribs are located at least on one side of the plurality of thermal superconductive fins, are extended along an arrangement direction of the plurality of thermal superconductive fins, and are fixedly connected with the side edge of each of the plurality of thermal superconductive fins.

9. The thermal superconductive finned heat sink according to claim 8, wherein a number of the plurality of reinforcing ribs is at least two, and the reinforcing ribs are located on each side of the plurality of thermal superconductive fins.

10. An electrical equipment chassis, comprising:
    a cabinet body, the side or back of the cabinet body including openings connecting inside with outside,
    a thermal superconductive finned heat sink, comprising:
       a base plate; and
       a plurality of thermal superconductive fins, inserted into a surface of the base plate,
       wherein each of the plurality of thermal superconductive fins has a composite plate structure and a thermal superconductive channel line which has a specific shape formed in the thermal superconductive fin, the thermal superconductive channel line is a closed channel line and is filled with heat-transfer working medium,
       each of the plurality of thermal superconductive fins has a U-shaped plate structure, the U-shaped plate structure includes a flat plate main body and sides which bends relative to the flat plate main body, and
       the projection area of the plurality of thermal superconductive fins, onto the plane where the base plate is located, is greater than the area of the base plate, wherein the thermal superconductive finned heat sink is fixed on one side of the cabinet body including the openings, and the base plate covers the openings; and a power device, located in the cabinet body and fixed on a surface of the base plate away from the plurality of thermal superconductive fins.

11. The thermal superconductive finned heat sink according to claim 2, further comprising reinforcing ribs, the reinforcing ribs are located at least on one side of the plurality of thermal superconductive fins, are extended along an arrangement direction of the plurality of thermal superconductive fins, and are fixedly connected with the side edge of each of the plurality of thermal superconductive fins.

12. The thermal superconductive finned heat sink according to claim 3, further comprising reinforcing ribs, the reinforcing ribs are located at least on one side of the plurality of thermal superconductive fins, and extend along an arrangement direction of the plurality of thermal superconductive fins, and are fixedly connected with the side edge of each of the thermal superconductive fins.

13. The thermal superconductive finned heat sink according to claim 4, further comprising reinforcing ribs, the reinforcing ribs are located at least on one side of the plurality of thermal superconductive fins, are extended along an arrangement direction of the plurality of thermal superconductive fins, and are fixedly connected with the side edge of each of the plurality of thermal superconductive fins.

14. The thermal superconductive finned heat sink according to claim 5, further comprising reinforcing ribs, the reinforcing ribs are located at least on one side of the plurality of thermal superconductive fins, are extended along an arrangement direction of the plurality of thermal superconductive fins, and are fixedly connected with the side edge of each of the plurality of thermal superconductive fins.

15. The thermal superconductive finned heat sink according to claim 6, further comprising reinforcing ribs, the reinforcing ribs are located at least on one side of the plurality of thermal superconductive fins, are extended along an arrangement direction of the plurality of thermal superconductive fins, and are fixedly connected with the side edge of each of the plurality of thermal superconductive fins.

16. The thermal superconductive finned heat sink according to claim 7, further comprising reinforcing ribs, the reinforcing ribs are located at least on one side of the plurality of thermal superconductive fins, are extended along an arrangement direction of the plurality of thermal superconductive fins, and are fixedly connected with the side edge of each of the plurality of thermal superconductive fins.

* * * * *